US009447493B2

(12) United States Patent
Helmersson et al.

(10) Patent No.: US 9,447,493 B2
(45) Date of Patent: Sep. 20, 2016

(54) PLASMA SPUTTERING PROCESS FOR PRODUCING PARTICLES

(75) Inventors: Ulf Helmersson, Brokind (SE); Nils Brenning, Johanneshov (SE); Daniel Soderstrom, Boxholm (SE)

(73) Assignee: Plasmadvance AB, Brokind (SE)

( * ) Notice: Subject to any disclaimer, the term of this patent is extended or adjusted under 35 U.S.C. 154(b) by 718 days.

(21) Appl. No.: 13/579,862

(22) PCT Filed: Feb. 22, 2011

(86) PCT No.: PCT/SE2011/050201
§ 371 (c)(1),
(2), (4) Date: Aug. 17, 2012

(87) PCT Pub. No.: WO2011/105957
PCT Pub. Date: Sep. 1, 2011

(65) Prior Publication Data
US 2012/0305385 A1 Dec. 6, 2012

Related U.S. Application Data

(60) Provisional application No. 61/307,475, filed on Feb. 24, 2010.

(30) Foreign Application Priority Data

Feb. 24, 2010 (SE) ...................................... 1050173

(51) Int. Cl.
C23C 14/34 (2006.01)
C23C 14/22 (2006.01)
(Continued)

(52) U.S. Cl.
CPC ............... *C23C 14/223* (2013.01); *B22F 9/12* (2013.01); *C23C 14/3485* (2013.01); *C23C 14/54* (2013.01); *C23C 14/544* (2013.01); *H01J 37/34* (2013.01); *B22F 2999/00* (2013.01)

(58) Field of Classification Search
CPC .............................. C23C 14/54; C23C 14/544
See application file for complete search history.

(56) References Cited

U.S. PATENT DOCUMENTS 3,926,147 A 12/1975 Steube
4,440,800 A 4/1984 Morton et al.
(Continued)

FOREIGN PATENT DOCUMENTS

DE 19804838 A1 8/1999
WO 99/47726 9/1999
WO 00/28969 5/2000

OTHER PUBLICATIONS

Ulf Helmersson, Martina Lattemann, Johan Bohlmark, Arutiun P. Ehiasarian, Jon Tomas Gudmundsson, "Ionized Physical Vapor Deposition (IPVD): A Review of Technology and Applications", pp. 1-24, Elsevier B.V., Science Direct, Thin Solid Films 513 (2006).
(Continued)

*Primary Examiner* — Jason M Berman
(74) *Attorney, Agent, or Firm* — Polster, Lieder, Woodruff & Lucchesi, LC

(57) ABSTRACT

A high production rate plasma sputtering process for producing particles having a size of 10 μm or less is disclosed. The process causes ionization of at least a part of the sputtered target atoms and is performed at such parameters that the pick-up probability of ionized sputtered target atoms on the surface of grains is high.

25 Claims, 6 Drawing Sheets

(51) Int. Cl.
  *C23C 14/54*  (2006.01)
  *B22F 9/12*   (2006.01)
  *H01J 37/34*  (2006.01)

(56) References Cited

U.S. PATENT DOCUMENTS 6,077,403 A * 6/2000 Kobayashi et al. ..... 204/192.12
2009/0014423 A1  1/2009 Li et al.

OTHER PUBLICATIONS

Shahid Rauf, Peter L. G. Ventzek, Valli Arunachalam, "Ionized Physical Vapor Deposition of Cu on 300 mm Wafers: A Modeling Study", AIP Journal of Applied Physics, pp. 89, 2525-2534, vol. 89, No. 5, American Institute of Physics, Mar. 1, 2001.

T.G. Snodgrass, J. L. Shohet, "A Statistical Analysis of Copper Bottom Coverage of High-Aspect-Ratio Features Using Ionized Physical Vapor Deposition", IEEE Transactions on Semiconductor Manufacturing, vol. 15, No. 1, pp. 30-38, Feb. 2002.

W. Jacobs, A. Kersch, A. Ruf, N. Urbansky, "Determination of Ti+-flux and Ar+-flux of Ionized Physical Vapor Deposition of Titanium from Multiscale Model Calibration with Test Structures", Journal of Vacuum Science and Technology A, AVS: Science & Technology of Materials, Interfaces, and Processing, pp. 922-936, vol. 21, No. 4, Jul./Aug. 2003.

International Preliminary Report for PCT application PCT/SE2011/050201 mailed Jan. 26, 2012.

International Search Report for PCT application PCT/SE2011/050201 mailed Jun. 1, 2011.

Franzreb et al, "Formation of neutral and positively charged clusters (Agn and Agn+; $n \leq 4$) during sputtering of silver", Surface Science Letters, 279, (1992), pp. L225-L230.

Gnaser et al, "The Emission of Neutral Clusters in Sputtering", Appl. Phys. A 48, (1989), pp. 261-271.

Kittel, Charles, "Introduction to Solid State Physics", Fifth Edition, ISBN 0-471-49024-5, John Wiley & Sons, Inc., (1976), cover pages and p. 32 (3 pages).

Anders, André, "Deposition rates of high power impulse magnetron sputtering: Physics and economics", J. Vac. Sci. Technol. A 28(4), American Vacuum Society, Jul./Aug. 2010, cover page and pp. 783-790 (9 pages).

* cited by examiner

PLASMA SPUTTERING PROCESS FOR PRODUCING PARTICLES

CROSS-REFERENCE TO RELATED APPLICATIONS

This is a national stage application under 35 U.S.C. §371 of International Application PCT/SE2011/050201 filed Feb. 22, 2011. The present application claims priority from U.S. Provisional Application Ser. No. 61/307,475 filed on Feb. 24, 2010, and from Swedish Application No. 1050173-2 filed on Feb. 24, 2010. All of these applications are incorporated herein by reference.

TECHNICAL FIELD

The present invention relates in general to a plasma sputtering process for producing small particles, i.e. particles with a size of 10 µm or less. More specifically, it relates to a plasma sputtering process in which sputtered target atoms are ionized by the plasma.

BACKGROUND

Nanoparticles are ultrafine particles whose size is below 1 µm, often less than 100 nm. They have received considerable attention because of their unique properties afforded by their small size and high surface-to-volume ratio. Nanoparticles are utilized in various technical fields, spanning from semiconductors, nanocomposite materials, catalysis and biomedical applications.

There are numerous possibilities for producing nanoparticles, such as sol-gel, chemical vapor deposition (CVD), and hydrothermal and spray pyrolysis methods. In recent years, methods for producing particles using plasma have been developed. These processes can be used for nucleation of particles, growth of particles and deposition of coatings on particle surfaces. Processes utilizing plasma inter alia have the advantages of small amounts of by-products, high purity of particles formed, and easy separation of particles from carrier gases.

One example of such a method is disclosed in US 2008/0271987 wherein nanoparticles are formed by introducing a process gas and an ambient gas into a reaction chamber and applying a plasma in a pulsed mode. Other examples of methods for producing nanoparticles by means of plasma are disclosed in for example U.S. Pat. No. 7,297,619 and US 2009/0014423.

A particular example of methods using plasma for producing particles, especially nanoparticles, is the plasma sputtering process. Sputtering is the physical ejection of atoms from a target surface. In the process, ions, for example argon ions, are generated in the plasma and drawn out of the plasma and accelerated across a cathode dark space. The target has a lower potential than the region in which the plasma is formed and the target surface therefore attracts positive ions. The positive ions move towards the target with a high velocity and then impact the target and cause atoms to physically dislodge or sputter from the target surface.

The plasma sputtering process inter alia has the advantage that the particles are formed from material of a solid target. The target can easily be manufactured and used in the process. A solid target is especially suitable in case particles are to be formed from metallic materials since it eliminates the need for metal species containing gases which often are toxic and require complex manufacturing methods.

DE 198 04 838 discloses a plasma sputtering process for depositing coating material or producing radicals on particle surfaces using a hollow cathode system. The process is conducted at a pressure of 0.01 mbar to atmospheric pressure, preferably 0.01-100 mbar. The plasma may be a pulsed plasma, which is achieved by controlling the pressure and operated at a power frequency of 50-60 Hz. A voltage of 200-500 V and a current of 0.1-2 A is used to form the plasma.

The problem with previously known plasma sputtering processes for production of particles is that the pick-up probability of atoms on the surface of particles generally is low. Therefore, the particles and/or the coatings have a slow growth rate, thus leading to low production rates of particles. Furthermore, since the production rate is so low, these methods are less suitable for production of particles which have a size in the range of a few micrometers.

SUMMARY

The object of the invention is to provide a plasma sputtering process for producing particles with a size of 10 µm or less, which process has an improved production rate.

The object is achieved by the process according to the independent claim 1. Preferred embodiments are defined by the dependent claims.

The plasma sputtering process for producing particles comprises providing a target in a plasma generating apparatus, wherein the plasma generating apparatus has a characteristic length $L_c$ such that $L_c^3$ equals the volume of the plasma generated in said apparatus. A process gas is introduced into the apparatus and the pressure inside the apparatus is controlled such that a predetermined process gas number density $n_G$ is obtained. A plasma is created and the energy provided to the plasma is controlled such that a predetermined plasma electron number density $n_e$ and a predetermined plasma electron temperature $T_e$ are obtained. Atoms are sputtered from the target by means of the plasma and the sputtered target atoms are allowed to be picked up on the surface of grains present in the apparatus.

The plasma electron number density and the plasma electron temperature are sufficient to ionize at least a part of the sputtered target atoms such that a pick-up flux of ionized sputtered target atoms on the surface of the grains is obtained.

Furthermore, the process gas number density, the plasma electron number density, and the plasma electron temperature of the process are such that $L_{ITA}/L_c \leq 0.5$. $L_{ITA}$ is the mean free path of the ionized sputtered target atoms inside said plasma, The plasma generating apparatus is operated by a pulsed power supply in order to obtain a sufficient power supply without unduly heating the cathode or risk undesirable electric discharge.

According to a preferred embodiment, the process gas number density, the plasma electron number density, and the plasma electron temperature are such that $\Gamma_{ITA}/(\Gamma_{ITA}+\Gamma_{NTA})$ is equal to or more than 0.5, preferably $\Gamma_{ITA}/(\Gamma_{ITA}+\Gamma_{NTA}) \geq 0.66$, more preferably $\Gamma_{ITA}/(\Gamma_{ITA}+\Gamma_{NTA}) \geq 0.70$. $\Gamma_{ITA}$ is the pick-up flux of ionized target atoms on the surface of grains present in said plasma and $\Gamma_{NTA}$ is the pick-up flux of neutral target atoms on the surface of grains present in said plasma.

According to another preferred embodiment, the process gas number density, the plasma electron number density, and the plasma electron temperature are such that $(1+3L_c/L_{ITA})(1+4W_e/W_{ITA})>10$. $W_{ITA}$ is the average kinetic energy of ionized sputtered atoms in said plasma and $W_e$ is the average electron kinetic energy inside said plasma related to $T_e$ through $W_e=(3/2)k_BT_e$.

According to another embodiment, the energy provided to the plasma is sufficient to obtain ionization of at least 20%, preferably at least 30%, of the sputtered atoms in said plasma. The particle production rate increases with increasing amount of ionized sputtered target atoms.

The plasma generating apparatus may suitably be a hollow cathode apparatus or a magnetron sputtering apparatus. In order to maximize the power obtainable by each pulse, the pulses should preferably be applied essentially as square pulses.

When using a pulsed power supply, the pulses should preferably be applied with a frequency of at least 100 Hz, suitably 200-2000 Hz, and have a duration of at least 5 microseconds, preferably 10-100 microseconds.

According to a preferred embodiment, the process gas number density $n_G$ and the electron number density $n_e$ are such that both $L_{ITA}/L_c \le 0.5$ and $W_{ITA}/W_e \le 0.5$ are fulfilled.

The process gas may be an inert gas, a reactive gas, a gas mixture of inert gases, or a gas mixture comprising at least one reactive gas and optionally at least one inert gas, and may suitably be used for creating the plasma. The process gas may preferably be used as a feed gas, but it is also possible that the process gas is stationary and not intended for transportation of any kind of particulate matter.

The grains may be introduced into the plasma generating apparatus or generated in-situ.

The plasma sputtering process is particularly suitable for producing nanoparticles, i.e. particles having a size of less than 1 μm, and especially particles having a size of about 5-500 nm. However, the process may also be used for producing bigger particles, such as particles in the order of 10 μm.

The process may be used for producing particles of all types of target materials, as long as the target material is conductive or at least semi-conductive. Moreover, particles of compound materials, for example oxides, carbides, nitrides and the like, may be produced by utilization of a reactive gas during the process.

The process according to the present invention can be used to nucleate particles, grow particles, create a particle of one material and coat said particle with the same or a different material, grow multiple layer structures etc. Thus, the process enables production of tailor-made particles.

DETAILED DESCRIPTION

Figure 1:
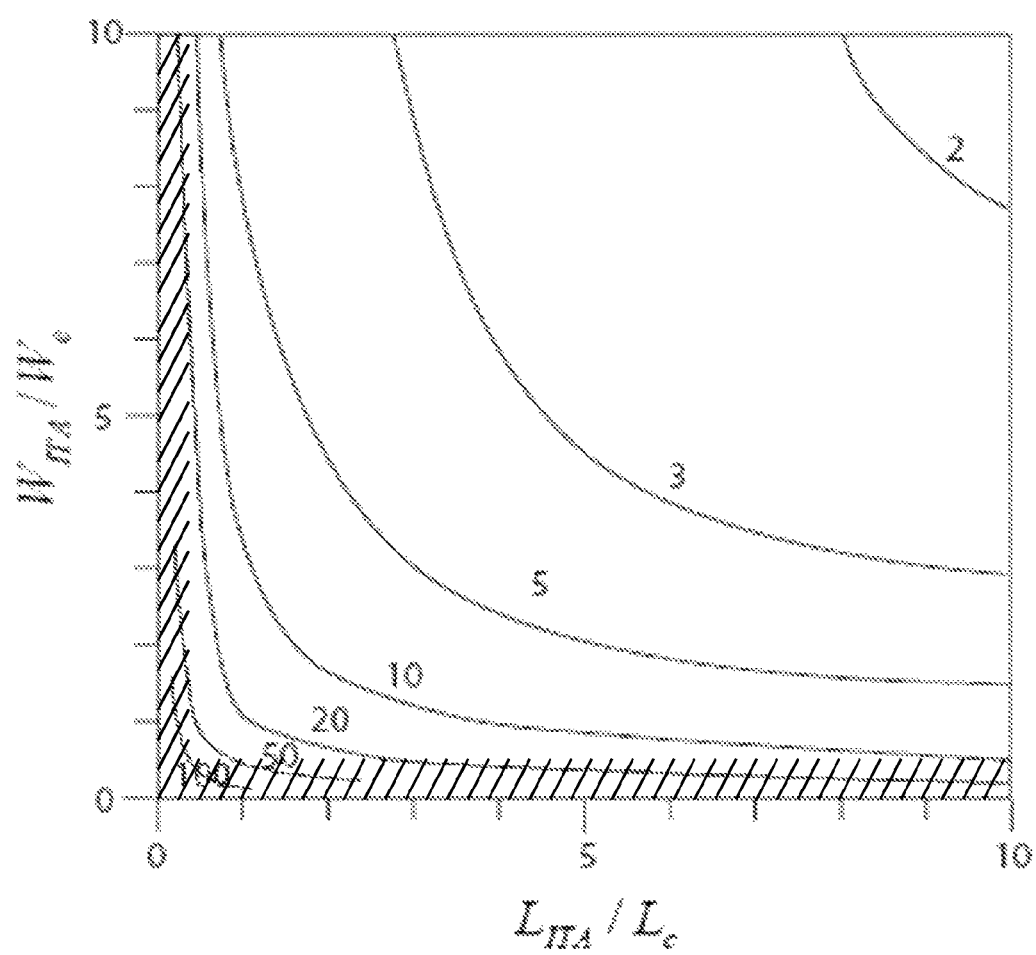
FIG. 1 illustrates curves for the pick-up probability of ionized sputtered target atoms compared to neutral sputtered target atoms as a function of $W_{ITA}/W_e$ and $L_{ITA}/L_c$.

In the present disclosure, the terms "producing particles", "production of particles", "produced particles" or similar expressions shall be interpreted in their broadest sense unless explicitly disclosed otherwise. Thus, these terms include growth of particles, nucleation and growth of particles, deposition of material on a previously formed particle or particle nucleus etc.

Furthermore, the term "grain" is used for a particle which is not yet in its finished state and the term thus includes a previously formed particle or particle nucleus on which material is to be deposited in order to produce the finished particle.

The term "particle" is used for the finished particle resulting from the process, unless explicitly disclosed otherwise.

Moreover, when temperatures are referred to in the present disclosure, for example $T_e$, $T_{ITA}$ and $T_G$, this shall be interpreted in a broad sense; they are the temperatures at which the average particle energy agree with the real average particle energies, e.g. $W_e=(3/2)k_BT_e$.

The process according to the present invention utilizes plasma sputtering to produce small particles, i.e having a size less than 10 μm. Sputtering is the physical ejection of atoms from a target surface. In the plasma sputtering process, ions, for example argon ions, are generated in the plasma and drawn out of the plasma and accelerated across a cathode dark space. The target has a lower potential than the region in which the plasma is formed and the target surface therefore attracts positive ions. The positive ions move towards the target with a high velocity and then impact the target and cause atoms to physically dislodge or sputter from the target surface.

The plasma thus etches a surface of a target to create atoms which are used to produce the particles by being picked up on the surface of grains present in said plasma. Some of the atoms will be ionized in the plasma. The amount of sputtered atoms which are ionized depends on the density of the plasma, the energy of the electrons and the type of atoms. Plasma sputtering as such is a previously known process and will therefore not be described in more detail in the present disclosure.

The plasma sputtering process according to the present invention utilizes a high-density plasma which ensures that a significant amount of the atoms sputtered from the target are ionized in the plasma. The amount of atoms being ionized depends on the density of the plasma and increases with increasing plasma density.

Grains can pick-up the atoms sputtered from the target when the atoms collide with the grains. Neutral sputtered atoms are only able to be picked-up on the surface of the grains when they hit the geometrical cross-section of a grain, and the probability of a collision is therefore low. However, since the grains generally are negatively charged by the plasma, the probability of a collision between a grain and a sputtered atom can be increased if the sputtered target atom is in the form of an ion. Ionized sputtered atoms are likely to enter a planetary orbit around the grain as a result of the electrical field around the grain. Therefore, in case the sputtered atoms are positively charged, the grains are able to attract the positive ions, thus resulting in an increased probability of pick up of the sputtered atoms on the surface of a grain. The pick-up probability of atoms on the surface of grains therefore increases for example with increasing density of the plasma, i.e. with increasing plasma electron number density.

The high pressure, i.e. the process gas number density, used in the plasma generating apparatus according to the present invention inter alia ensures that the velocity of the sputtered atoms is lower than in case conventional operating pressures are used. Since the velocity of the sputtered atoms is comparatively low, the grains are more likely to be able to attract the ionized atoms inter alia as the atoms have longer retention time in the plasma and the probability of a collision is therefore increased. Therefore, the predetermined process gas number density used in accordance with the present invention increases the pick-up probability and rate of atoms on the surface of the grains, thus leading to a higher production rate of particles.

In the process according to the present invention, the probability of atoms sputtered from the target to be picked up by a grain is not only dependent on collisions with neutrals and the geometrical extension of the particle, as in the case of normally used processes, but also on the increase in path length due to ion-ion collisions and the increase of the trapping volume around the grain due to the attractive force between the positive ion and the negative particle. Thus, it is clear that the production rate of particles is substantially increased by the process according to the invention.

In accordance with the present plasma sputtering process, the plasma electron number density $n_e$ and plasma electron temperature $T_e$ are sufficient to cause ionization of at least a part of the sputtered target atoms and create a pick-up flux of ionized sputtered target atoms on grains. Preferably, the process gas number density $n_G$, the plasma electron number density $n_e$ and plasma electron temperature $T_e$ are sufficient to cause a pick-up flux $\Gamma_{ITA}$ of the ionized sputtered target atoms on the surface of the grains which is higher than the pick-up flux $\Gamma_{NTA}$ of neutral sputtered atoms on the surface of the grains.

The process is conducted such that $L_{ITA}/L_c \leq 0.5$. Preferably, the process is conducted such that, in addition to the criterion $L_{ITA}/L_c \leq 0.5$, at least one of the following three criteria is fulfilled:

$$\Gamma_{ITA}/(\Gamma_{ITA}+\Gamma_{NTA}) \geq 0.5,$$

$$W_{ITA}/W_e \leq 0.5, \text{ and}$$

$$(1+3L_c/L_{ITA})(1+4W_e/W_{ITA}) > 10.$$

$\Gamma_{ITA}$ is the pick-up flux of ionized target atoms on the surface of the grains, $\Gamma_{NTA}$ is the pick-up flux of neutral target atoms on the surface of the grains, $L_{ITA}$ is the mean free path of the ionized sputtered target atoms inside said plasma, $W_{ITA}$ is the average kinetic energy of ionized sputtered atoms in said plasma and $W_e$ is the average electron kinetic energy inside said plasma related to $T_e$ through $W_e=(3/2)k_B T_e$.

It has been found that a significantly increased productivity can be achieved by means of the plasma sputtering process according to the present invention. This is mainly a result of the fact that the pick-up probability of ionized target atoms, ITA, on the surface of grains is significantly higher than the pick-up probability of neutral target atoms, NTA.

The high pick-up flux of ionized target atoms is achieved by operating the plasma sputtering apparatus in a specific parameter regime, defined by the process gas number density $n_G$, process gas temperature $T_G$, electron number density of the plasma $n_e$, electron temperature of the plasma $T_e$ and the characteristic length $L_c$, as disclosed above. The characteristic length $L_c$ is such that $L_c^3$ equals the volume of the plasma generated in said apparatus, wherein the plasma volume is defined as the region within which the distance to the wall of the apparatus is longer than the plasma Debye length, $\lambda_D = \sqrt{\epsilon_0 k_B T_e/(n_e e^2)}$. By operating in such a specific parameter regime, it is ensured that a significant amount of the sputtered target atoms, TA, becomes ionized in the plasma, and that the pick-up efficiency of the ionized target atoms, ITA, is significantly higher than that of neutral target atoms, NTA.

The required degree of ionization $n_{ITA}/(n_{NTA}+n_{ITA})$ is obtained by operating at $n_e$ and $T_e$ that are so high that the probability for electron impact ionization of the target atoms is significant during their residence time in the plasma. High $n_e$ and $T_e$ are achieved by supplying high enough energy to the plasma.

The required high pick-up efficiency of the ionized sputtered target atoms, ITA, is obtained by a combination of two effects that both appear when the ITA collision mean free paths are smaller than the characteristic length of the apparatus $L_c$. The first effect is that the pick-up rate, through electrostatic attraction of the ITA to the negatively charged grains, increases drastically when the average kinetic energy of ITA, $W_{ITA}$, becomes lower than the average electron kinetic energy $W_e$. $W_e$ is related to $T_e$ through $W_e=(3/2)k_B T_e$, wherein $k_B$ is the Boltzmann constant. The required low $W_{ITA}$ is achieved by keeping $n_G$ so high that the ITA mean free path, for thermalizing collisions with the process gas, is much smaller than $L_c$. The second effect is that a smaller mean free path for momentum-exchange collisions, gives a longer retention time of ITA, and thereby increases the fraction of ITA that may be picked up on grains present in the plasma before leaving the plasma region. Both collisions between ITA and filling gas, and collisions between ITA and plasma ions, contribute to a longer retention time of ITA in the plasma. Higher collision rate between ITA and gas is achieved by higher process gas density, defined by the process gas number density $n_G$. Higher collision rate between ITA and plasma ions is achieved by a combination of higher plasma density, defined by the plasma electron number density $n_e$, and lower ITA average energy $W_{ITA}$, the latter because the ion-ion Coulomb collision cross section increases with decreasing $W_{ITA}$.

In accordance with the plasma sputtering process of the invention, the parameters $n_G$, $T_G$, $n_e$ and $T_e$ are thus controlled as summarized below.

The process gas number density $n_G$ should be high in order to efficiently thermalize the ionized sputtered target atoms, ITA, and to increase the retention time of ITA in the plasma.

The process gas temperature $T_G$ should be low in order to obtain a low average kinetic energy of ionized sputtered target atoms, ITA, which in turn gives more efficient electrostatic pick-up on the grains and contributes to the longer retention time of ITA through its influence on Coulomb ion-ion collisions.

The electron number density of the plasma $n_e$ should be high in order to ionize sputtered target atoms during their residence time in the plasma, and contribute to a longer retention time of the ionized sputtered target atoms in said plasma.

The electron temperature of the plasma should be sufficiently high to enable ionization of sputtered target atoms during their residence time in the plasma, and to keep the average kinetic energy of ITA, $W_{ITA}$, much lower than the average electron thermal energy, $W_e$.

Thus, by controlling the above identified parameters it is possible to achieve a significantly higher pick-up flux of ionized target atoms, compared to the pick-up flux of neutral target atoms, on the surface of grains. The productivity of the plasma sputtering process according to the present invention is therefore significantly higher than that of conventional plasma sputtering processes for production of particles.

It is obvious to the person skilled in the art that appropriate specific values of the above specified parameter depend on the kind of plasma generating apparatus used as well as the dimensions of the apparatus, and the material used for producing the particles. However, the skilled person could easily determine the specific values of the parameters for a selected plasma generating apparatus and material used for producing the particles, as long as they fulfill the criteria that a considerable amount of the sputtered target atoms are ionized by the plasma such that a pick-up flux of ionized sputtered target atoms to the surface of the grains is obtained.

In accordance with the process of the invention, $L_{ITA}/L_c \le 0.5$. When this criterion is fulfilled, the created ITA is efficiently used for growth of particles. A shorter mean free path results in a slower diffusion and longer residence time of the ionized sputtered target atoms inside the plasma volume, thus a greater possibility to be picked-up by a grain rather than escaping to the walls of the apparatus. A shorter $L_{ITA}$ also reduces the need for a high grain density in the plasma during the growth process since the ITA residence time becomes longer and the ITA have a greater chance of being picked-up on grains at a given grain density. As previously discussed, both ion-neutral (ITA-gas) collisions and ion-ion (ITA-plasma ion) collisions contribute to a longer diffusion time.

In accordance with one embodiment on the invention, $\Gamma_{ITA}/(\Gamma_{ITA}+\Gamma_{NTA}) \ge 0.5$. Although the fluxes $\Gamma_{ITA}$ and $\Gamma_{NTA}$ are difficult to measure directly, it can indirectly be shown that it is realistic to reach the parameter range covered by this criterion. A high degree of ionization of the sputtered target atoms can be obtained by operating at $n_e$ and $T_e$ that are so high that the probability for electron impact ionization of the sputtered target atoms is high enough during their residence time in the plasma. High enough $n_e$ and $T_e$ are obtained by supplying high enough energy to the plasma. This can be done, for example, as disclosed in Helmersson et al., 2006, Thin Solid Films, 513, 1-24, by using a separate induction coil as in inductively coupled plasma-magnetron sputtering (ICP-MS), or by using pulsed discharges as in high power impulse magnetron sputtering devices (HiPIMS). In HiP-IMS devices, some cases are reported with more than 90% sputtered metal ions during the active phase of the discharge, Bohlmark et al., 2005, J. Vac, Sci. Technol, A23, 18; Lundin et al., 2008, Plasma Sources Sci. Technol. 17, 125009. Considering a grain in such a plasma environment, where the density of ionized target atoms is higher than the density of neutral target atoms; even if the positively charged ITA were not attracted by the negatively charged grains, $\Gamma_{ITA}$ would be larger than $\Gamma_{NTA}$. The criterion $\Gamma_A/(\Gamma_{ITA}+\Gamma_{NTA}) \ge 0.5$ would thus be fulfilled. It is therefore clear that the criterion may be fulfilled if introducing grains in already existing and well studied plasma devices.

In accordance with yet another embodiment of the invention, $W_{ITA}/W_e \le 0.5$. The reason for this criterion is that, given the same grain density, the pick-up rate of ITA on grains increases drastically in this range of $W_{ITA}$, due to the electrostatic attraction. The required low $W_{ITA}$ is achieved by keeping $n_G$ so high that the ITA mean free path, for thermalizing collisions with the gas, is much smaller than $L_c$.

A special case may be considered, where the process according to the invention is conducted in a vertically arranged hollow cathode plasma generating apparatus with a flow of process gas through the cathode. The flow of process gas, plasma and grains out of the lower cathode opening are expanded in the region just below the cathode, and mixed with the surrounding process gas, which causes the temperature of the constituents to develop differently. The neutral process gas is mixed with the cooler ambient process gas and the mixture obtains a common temperature $T_{gm}$. The ionized sputtered target atoms, ITA, are, by collisions with this neutral gas, cooled down rapidly approaching $T_{ITA} \approx T_{gm}$. The electrons on the other hand lose energy much slower since the energy loss collision mean free path for electrons, through elastic collisions with gas atoms, is in the order of $\lambda_{energy} \approx \lambda_{elastic}(2m_{gas}/m_e)$. The rapid cooling of the ITA combined with the much slower cooling of the electrons therefore gives a plasma in the parameter range $W_{ITA} < 0.5 W_e$, in the region just below the hollow cathode.

The particle energy distributions in plasma discharges usually depart from exact thermal "Maxwellian" distributions. For electrons, the high energy tail can depart from a Maxwellian for several reasons. Overpopulations of the tail can result if the electrons are energized by electric fields and cooled by Coulomb ion-electron collisions, since such collisions are represented by cross sections that decrease drastically with increasing electron energy. Underpopulations of the electron high energy tail can result from ionization and excitation collisions with neutrals that occur only for energies above the threshold values for the process according to the invention. Departures from thermal distributions of ions are also expected for various reasons.

The criteria $L_{ITA}/L_c \le 0.5$ and $W_{ITA}/W_e \le 0.5$ are independent and can be shown by considering a special case. Consider an ITA with a thermal speed $u_{ITA}$ that starts at a distance $L_c$ from the wall of the apparatus. The diffusion time is of the order of $$\tau_{diff} \approx \frac{L_c^2}{D} \approx \left(\frac{L_c}{u_{ITA}}\right)\left(1+\frac{3L_c}{L_{ITA}}\right),$$

where the diffusion coefficient expression $D \approx L_{ITA} u_{ITA}/3$ has been used, and a function has been chosen that approaches $L_c/u_{ITA}$ in the collision-free case. The probability that the ITA encounters a grain before escape to the wall is therefore approximately proportional to $(1+3L_c/L_{ITA})$.

The probability of collection at such an encounter depends on the potential of the grain and the energy and charge of the ITA. This is a problem that is well studied in plasma physics because it is central in both Langmuir probe theory and in dusty plasma physics. The probability of collection is, in the range $W_e > W_{ITA}$, approximately proportional to $(1 + 4\, W_e/W_{ITA})$. The dependence on $W_e/W_{ITA}$ is qualitatively easy to understand. The negative potential of the grains is proportional to the electron energy, typically of the order of $3k_B T_e/e$. With a given potential, a low energy ITA is easier to attract and therefore is represented by a larger collection probability. These two mechanisms can be summed up in one approximate equation Eq. 1 for the probability P of an ITA, starting at a distance $L_c$ from the wall, to be collected on a grain rather than escape to the walls.

$$P_{ITA\text{-}colection} \propto (1 + 3 L_c/L_{ITA})(1 + 4 W_e/W_{ITA}) \qquad \text{(Eq. 1)}$$

The effect of Eq.1 is illustrated in FIG. 1. The curves represent the equal values for the right hand side of Eq. 1. Higher values correspond to more efficient collection of ionized sputtered target atoms on the surface of grains. Each curve is marked with a value of Eq. 1 for the specific combination of parameters $L_{ITA}/L_c$ and $W_{ITA}/W_e$. Moreover, the Figure illustrates the criteria $L_{ITA}/L_c \le 0.5$ and $W_{ITA}/W_e \le 0.5$.

It is clear from FIG. 1 that the pick-up probability of an ionized sputtered target atom on the surface of a grain increases with reducing ratio between $L_{ITA}$ and $L_c$ as well as with reducing ratio between $W_{ITA}$ and $W_e$.

Thus, in accordance with a preferred embodiment of the plasma sputtering process, the process gas number density $n_G$ and the electron number density $n_e$ are such that both of the following two criteria is fulfilled:

$$\frac{L_{ITA}}{L_c} \le 0.5 \text{ and } \frac{W_{ITA}}{W_e} \le 0.5$$

Reducing the criterion $L_{ITA}/L_c$ increases the pick-up rate of ionized target atoms on the surface of the grains, as indicated in FIG. 1. Therefore, $L_{ITA}/L_c$ is preferably equal to or less than 0.4, more preferably equal to or less than 0.3.

Furthermore, the pick-up rate of ionized target atoms on the surface of grains increases with reduced $W_{ITA}/W_e$, as indicated in FIG. 1. Therefore, $W_{ITA}/W_e$ is preferably equal to or less than 0.4, more preferably equal to or less than 0.3.

It is evident from FIG. 1 that the probability of a sputtered target atom on the surface of a grain, and thus the productivity, is highest when both the above identified criteria are fulfilled.

The process according to the present invention can for example be used for growing particles by introducing previously formed particles or particle nuclei into the process and utilizing the process to deposit sputtered target atoms on the surface of the previously formed particles or particle nuclei. The previously formed particles or particle nuclei can be introduced into the plasma sputtering apparatus in accordance with previously known methods. It should be noted that the term "grains" used in the present disclosure in such a case relates to said previously formed particles or particle nuclei.

It is also possible to coat already formed particles of a first material with a second material by the present process by introducing the particles of the first material, said particles of the first material thus constituting grains in the present disclosure, into the process and using a target comprising the second material.

The first material and the second material may be the same material or may be different materials.

The process according to the present invention may also be used for producing particles by forming particle nuclei in-situ and growing said particle nucleus to form particles.

Furthermore, it is possible to produce particles of compounds, such as oxides, carbides, nitrides or the like, by introducing a reactive gas, or a gas mixture comprising a reactive gas, wherein the reactive gas comprises a compound forming element. In the present disclosure, a reactive gas is a gas which comprises at least one element which may react with the surface of the grains or the surface of formed particles thus forming a compound. A reactive gas according to the present disclosure may also be a gas comprising an element which may react with the sputtered target atoms before they are collected on the grains. In case the reactive gas is for example an oxygen comprising gas or a nitrogen comprising gas, the reactive gas can also constitute the process gas and be used for creating the plasma.

The reactive gas, or the gas mixture comprising a reactive gas, is preferably introduced into the plasma region of the plasma generating apparatus in order to maximize the effect thereof. However, it is also possible to introduce the reactive gas, or the gas mixture comprising the reactive gas, just outside of the plasma region, but before the particles are collected. This is a preferred alternative if only the surface of the particles should be reacted with the reactive element of the reactive gas.

Moreover, the process may naturally also be used for producing particles comprising a multiple layer structure.

Thus, it is clear from the above that the plasma sputtering process may be used for producing tailor-made particles.

The productivity of the plasma sputtering process increases drastically with increasing degree of ionized sputtered target atoms. Therefore, the energy supplied to the plasma should preferably be sufficient to obtain an ionization of at least 20%, more preferably at least 30%, of the sputtered target atoms. According to a particularly preferred embodiment, at least 45% of the sputtered target atoms are ionized in the plasma.

There is a variety of possibilities for obtaining the required high-density plasma. It is commonly known that a high-density plasma can be created by increasing the power applied to the plasma. However, increasing the power can increase the risk of establishing an electrical breakdown condition which could lead to an undesirable electrical discharge in the apparatus. Therefore, according to the present invention, the high-density plasma is formed using pulsed electric power supply, such as a pulsed direct current (DC). The pulsed power enables a high power supply in the pulse without unduly heating the cathode. This is a result of the average discharge power being low while relatively large power pulses are periodically applied.

The pulses are preferably applied essentially in the form of square pulses in order to maximize the power obtained by each pulse and ensure that sufficient power is applied to the plasma during operation. However, it also is conceivable to use a sinusoidal pulse even though this is less preferred.

The specific conditions for the duration of the pulses, frequency and power should preferably be adapted to the material and size of the cathode, i.e. the target, as well as the plasma generating apparatus used. Preferably, a frequency of about 200-2000 Hz is used and the duration of each pulse could suitably be about 10-100 microseconds, preferably about 20-70 microseconds. The skilled person could however easily determine the specific parameters for a selected material and size of the cathode by mere routine tests.

By way of example only, in the case a titanium hollow cathode with an inner diameter of 5 mm and a length of 50 mm is used, the discharge current could suitably be about 40 A, the duration of the pulses about 20-50 microseconds and the repetition frequency about 600 Hz. Furthermore, approximately the same parameters could be used for hollow cathodes of the same dimensions, where the hollow cathode is made of molybdenum or copper.

According to a preferred embodiment, the process according to the invention is performed in a hollow cathode system. It is commonly known that it is possible to obtain plasmas with high density in such systems. Hollow cathode systems are able to very efficiently use essentially all the ions from the target thus leading to a very efficient process. Furthermore, it is also easy to control the gas flow through a hollow cathode system which in turn enables efficient process control. For example, the size of the particles can be easily controlled by the gas flow. Moreover, a hollow cathode system provides a process wherein the grains are enclosed by the target. An additional advantage of a hollow cathode system is that the process can be designed to be a continuous process. This is naturally an advantage over a batch operating system wherein the process has to be shut down for removing the formed particles and where it might be more difficult to control the retention time of the grains inside the plasma.

Another advantage of the hollow cathode plasma generating apparatus is that when flowing the process gas through the hollow cathode, instead of providing the process gas into the apparatus for example from the side, the process gas expands when leaving the area of the hollow cathode, and the temperature of the gas is thus reduced. This effect facilitates the formation of the particles as it automatically cools the grains and the formed particles.

Moreover, it is possible to arrange a plurality of hollow cathode targets, one after another, in order to form a hollow cathode target system. The different hollow cathodes in the system may for example be made of different materials, thus enabling a plasma sputtering process wherein particles of a multiple layer structure are produced. Such a hollow cathode system thereby eliminates the need for collection of the particles after deposition of each separate layer and thus significantly increases the productivity of particles having multi-layered structures.

It is however obvious to the skilled person that the process according to the invention can also be performed in other types of systems which are able to generate a plasma with high density. For example, the process according to the invention may be suitably is performed using a magnetron sputtering system. Magnetron sputtering systems use magnetic fields that are shaped to trap and concentrate secondary electrons proximate to the target surface. The magnetic fields increase the density of electrons and, therefore, increase the plasma density in a region that is proximate to the target surface. The increased plasma density increases the sputter deposition rate.

The plasma sputtering magnetron apparatus may suitably be an apparatus using a separate induction coil as in inductively coupled plasma magnetron sputtering (ICP-MS) or an apparatus using pulsed discharges as in high power impulse magnetron sputtering devices (HiPIMS). This has previously been disclosed in Helmersson et al, 2006, Thin Solid Films, 513, p 1-24, which is incorporated herein by reference.

The process according to the present invention can be used for producing particles comprising all types of materials. Cathode materials are all conductive, or at least semi-conductive, materials, including electrically conducting compounds or composites wherein at least one of the components in the composite is electrically conducting.

The particles produced by means of the plasma sputtering process according to the present invention may be collected in accordance with state of the art techniques. For example, the particles may be collected on a substrate or by a system wherein the particles are suspended in a carrier gas.

In case the particles are to be collected on a substrate, it should however be noted that such a substrate should preferably be located sufficiently far from the cathode and the plasma in order to allow the formed particles to be efficiently cooled before they are collected. The suitable distance depends on the plasma generating apparatus used, the material from which the particles are formed, and the specific parameters selected for the process. However, the skilled person can determine a suitable distance by routine tests. If desired, a flow of cooling gas can be introduced into the apparatus downstream of the plasma, but upstream of the substrate, for collection in order to facilitate the cooling of the particles before collection. An example of a suitable cooling gas is helium.

As previously discussed, the specific values of the parameters used in the process depend on the apparatus used, the dimensions thereof, and the material from which the particles are to be produced. However, for most cases it is preferred that the electron number density of the plasma $n_e$ is at least $10^{17}/m^3$, preferably at least $10^{18}/m^3$. Also, for most cases it is preferred that the average power supplied to the cathode is at least 30 000 W/m², preferably at least 35 000 W/m².

Moreover, for most cases it is preferred that the process gas number density $n_G$ is equal to a process gas number density of at least $3*10^{21}/m^3$, preferably at least $10^{22}/m^3$, for a case where the plasma generating apparatus is a hollow cathode apparatus wherein the hollow cathode has an inner diameter of 5 mm (which corresponds to a pressure of about 0.1 Torr). The specified values for the process gas number density have been given as equal to the process gas number density for a specific case since they depend on the apparatus used and the dimensions thereof, and thus cannot be specified for each specific case. Thus, for a selected apparatus and dimension thereof other than the specified case, the values of the process gas number density are to be recalculated for the apparatus used and the dimension thereof, such that they correspond to the above specified specific case. For example, for a hollow cathode with an inner diameter of 600 μm, the process gas number density should preferably be about $3*10^{24}/m^3$ (which corresponds to a pressure of about 100 Torr).

The process can be used for producing particles having a size ranging from about 1 nm to about 10 μm, and is particularly suitable for nanoparticles having a size of about 5 nm to 500 nm.

The particles produced by means of the plasma sputtering process may be essentially spherical. However, they may also have other shapes, such as essentially oval or have an irregular shape, depending on the material from which the particles are produced and the selected parameters used during the process.

Experimental Results—Degree of Ionization Titanium particles were produced in a plasma sputtering apparatus comprising a vertically arranged hollow cathode in accordance with one embodiment of the invention, using a pulsed direct current power supply. The duration of the pulses was set to 50 μs, and the pulses were applied using a square pulse at a frequency of 600 Hz. The average power supply to the hollow cathode was about 72 W. Furthermore, the process was repeated in the same apparatus using plasma generated by means of a constant (non-pulsed) direct current power supply, operated at about 80 W.

In both cases, a hollow cathode of titanium having an inner diameter of 5 mm and a length of 50 mm was used. Argon was used as process gas and introduced into the apparatus from the side of the apparatus and below the hollow cathode. The pressure inside the apparatus was kept at about 1 Torr during operation by means of controlling the flow of the process gas into the apparatus.

Figure 2A:
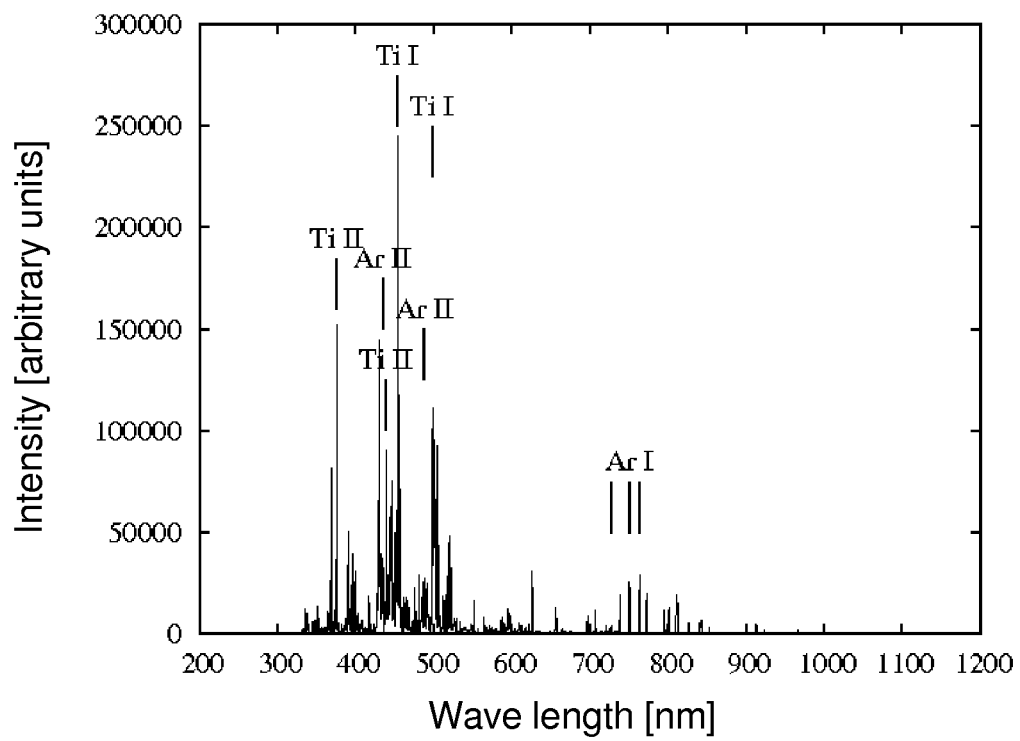
FIG. 2a shows a spectrum obtained by an optical spectrograph for a plasma sputtering process using a titanium hollow cathode, and wherein the plasma is generated by means of a pulsed power supply.
Figure 2B:
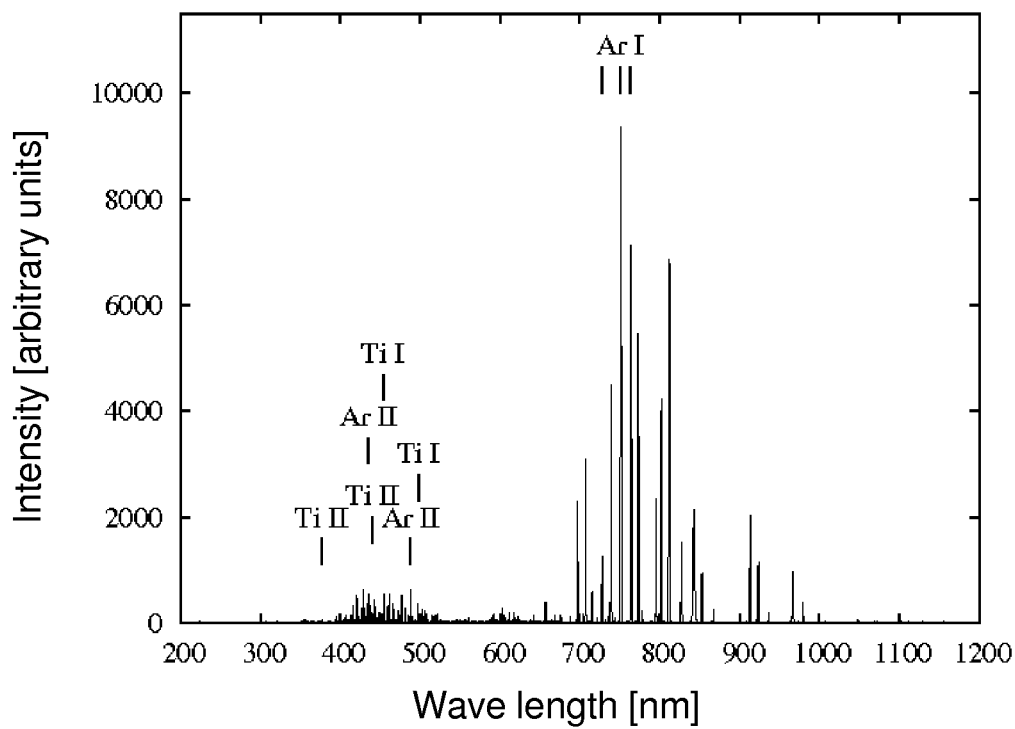
FIG. 2b shows a spectrum obtained by an optical spectrograph for a plasma sputtering process using a titanium hollow cathode, and wherein the plasma is generated by means of a non-pulsed power supply.

In order to investigate the ion density in the plasma, an optical spectrograph was used. Spectra were detected from above the hollow cathode and along the central axis thereof. FIG. 2a shows the result of the process using a pulsed power supply, and FIG. 2b shows the result of the process when using a non-pulsed power supply. Various peaks are identified in the figures, wherein "TiII" relates to singly ionized titanium atoms, "TiI" relates to excited neutral titanium atoms, "ArII" relates to singly ionized argon atoms and "ArI" relates to excited neutral argon atoms.

It is clear from FIG. 2a that sputtered titanium atoms are ionized during the process. However, in the process using a constant power supply, the amount of ionized titanium atoms was considerably lower as is shown in FIG. 2b.

Figure 2C:
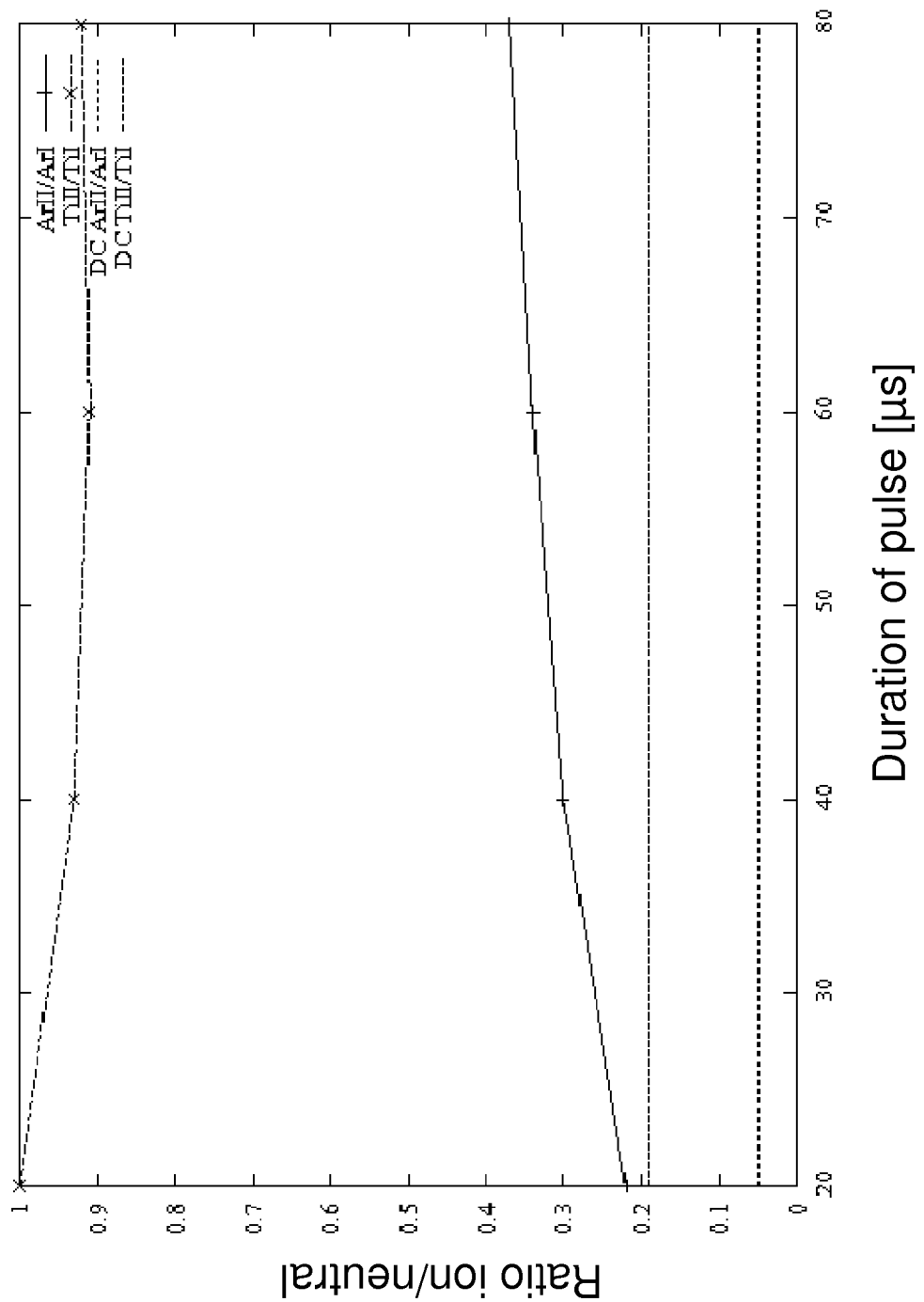
FIG. 2c shows the ratio between ions and neutrals as a function of the duration of the pulses for a plasma sputtering process using a titanium hollow cathode and the ratio between ions and neutrals for a plasma sputtering process using a non-pulsed power supply.

Moreover, the effect of the duration of the pulse was investigated. FIG. 2c shows the ratio between ions and neutrals as a function of the duration of the pulses. The line denominated "ArII/ArI" shows the ratio of ionized argon ions and neutral argon atoms and the line denominated "TiII/TiI" shows the ratio of ionized titanium atoms and neutral titanium atoms, respectively, when a pulsed plasma was used. The lines denominated "DC ArII/ArI" and "DC TiII/TiI", respectively, show the ratios when a non-pulsed plasma was used.

The figure shows that the ratio between titanium ions and titanium neutrals is about 1 when a 20 μs pulse was used, which corresponds to a degree of ionization of about 50%. However, in the case of the non-pulsed power supply, the ratio between ions and neutrals was less than 0.2, which implies that the degree of ionization of the sputtered target atoms is less than about 17%.

The figure also indicates that the degree of ionization of sputtered titanium atoms is somewhat lower when using longer pulses than 20 μs, however the degree of ionization of the argon atoms is increased.

It should be noted that the results above are relatively rough as it is not certain that the spectra were determined where the ion density is the highest. However, it clearly illustrates that a significantly higher degree of ionization of sputtered target atoms is possible when using a pulsed power supply to create the plasma. Moreover, it is clear that it is possible to obtain a degree of ionization of sputtered titanium atoms in the order of 50%. This will lead to a significant pick-up flux of sputtered target atoms to the surface of the grains.

Experimental Results—Molybdenum Particles

Particles of molybdenum were produced in a plasma sputtering apparatus comprising a vertically arranged hollow cathode. The cathode had an inner diameter of 5 mm and a length of 50 mm. Argon was used as process gas and was flown through the hollow cathode. The pressure was controlled at about 1.0 Torr. The plasma was produced using a pulsed power supply with duration of the pulses of 40 μm and at a frequency of 500 Hz. The average power was about 110 W obtained by using a maximum current of about 50 A and a maximum voltage of about −640 V.

The particles were collected on a Ta-coated substrate of Si located approximately 10 cm below the hollow cathode. A voltage of about +30V was applied to the substrate in order to efficiently collect the particles.

Figure 3A:
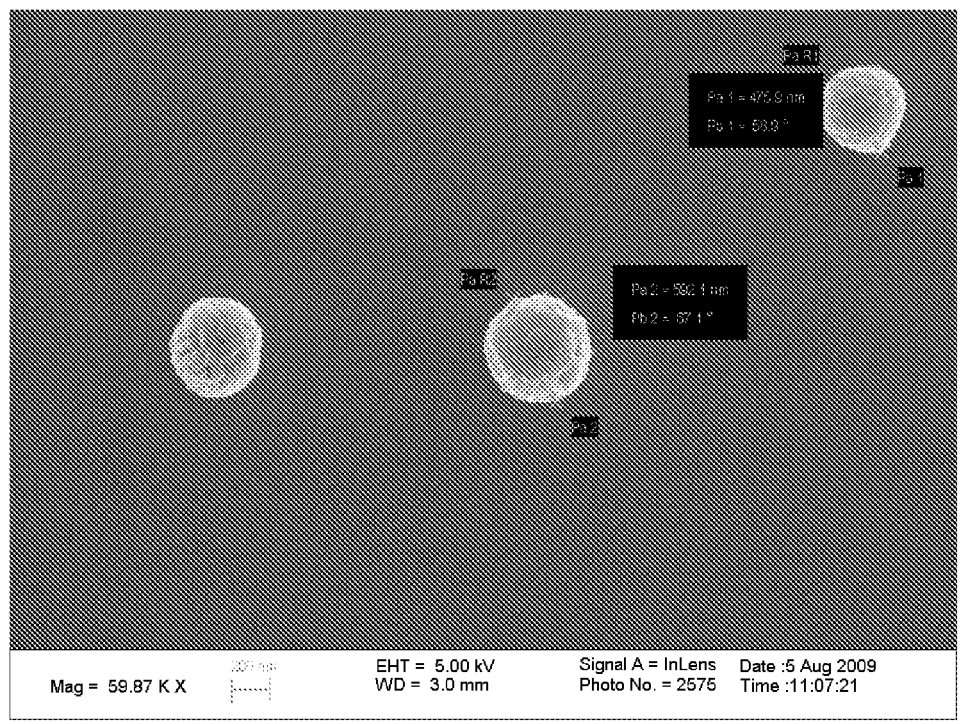
FIG. 3a shows a SEM-photograph of molybdenum particles produced in accordance with an embodiment of the process according to the invention.

FIG. 3a shows photograph of particles obtained by the process taken in a scanning electron microscope (SEM) at a magnification of 59780 times. The diameter of the particles ranged from about 450 nm to about 600 nm. As can be seen from the figure, the particles were essentially spherical and had slightly uneven surfaces, which indicates that they were formed at a relatively low temperature.

Figure 3B:
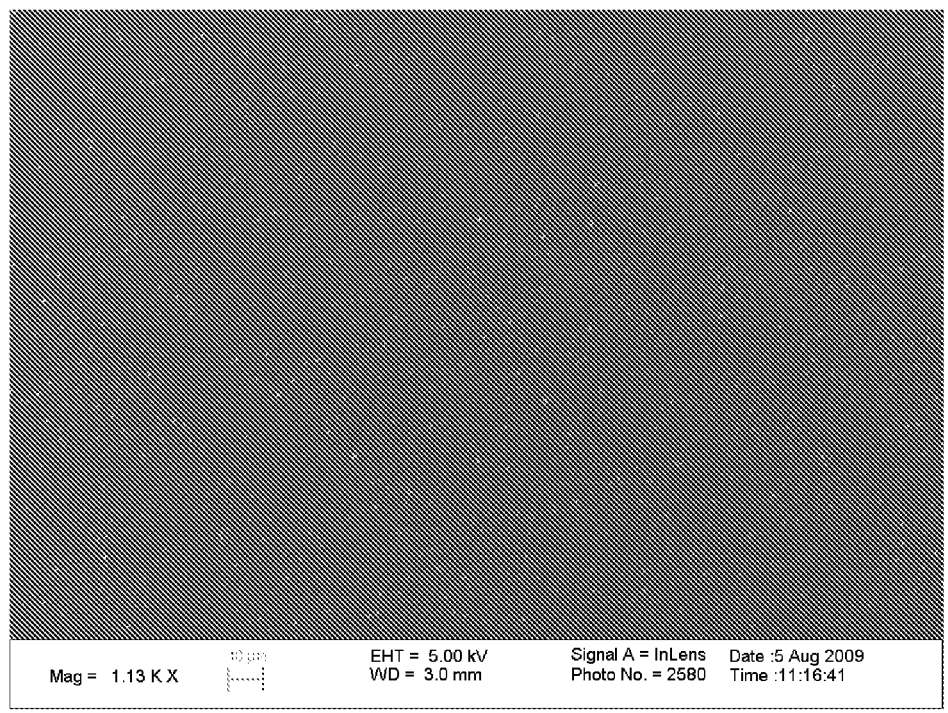
FIG. 3b shows a SEM-photograph of the particles shown in FIG. 3a at a different magnification.

FIG. 3b shows a corresponding SEM-photograph of the particles (the bright dots) at a magnification of 1130 times. It is clear from the picture that the particles are well dispersed, i.e. not agglomerated, and have a relatively narrow size distribution.

The mean free path of the ionized sputtered target atoms was theoretically estimated to less than 1 mm, and the criterion $L_{ITA}/L_c<0.5$ was thus satisfied with a margin of at least a factor 10 considering that $L_c^3$ equals the volume of the plasma. Even if considering the characteristic length $L_c$ of the apparatus to be the inner diameter of the cathode, the criterion $L_{ITA}/L_c<0.5$ would be satisfied with a margin of at least a factor 2.5. Thus, it is clear that it is possible to produce particles in accordance with the criteria of the process according to the invention.

In a second test, molybdenum particles were produced in principally the same apparatus as in the previous test. The same duration of the pulses, frequency, dimension of the hollow cathode, process gas and pressure were used as in the previous test, and the process gas was flown through the cathode. The average power was however in this case 80 W, obtained by using a maximum current of about 35 A and a maximum voltage of about −600V. A voltage of about +40V was applied to the substrate used for collecting the particles. Moreover, the plasma was in this second test allowed to extend towards the vicinity of the substrate where the particles were collected, which may for example be achieved by allowing the substrate to be the closest earth connection to the plasma.

Figure 3C:
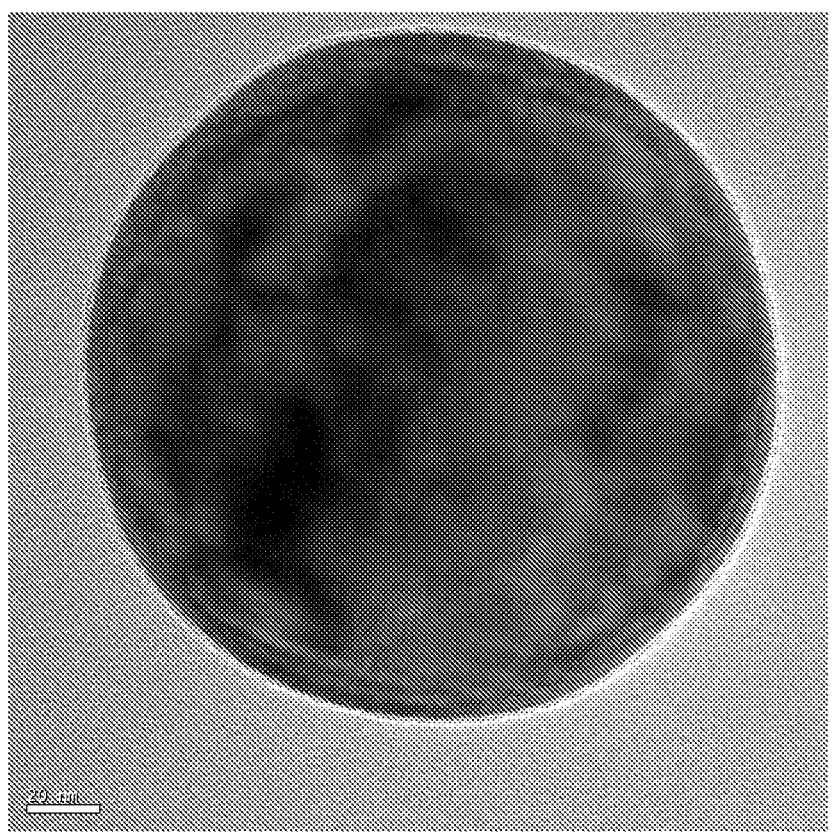
FIG. 3c shows a TEM-photograph of a molybdenum particle produced in accordance with an embodiment of the process according to the invention.
Figure 3D:
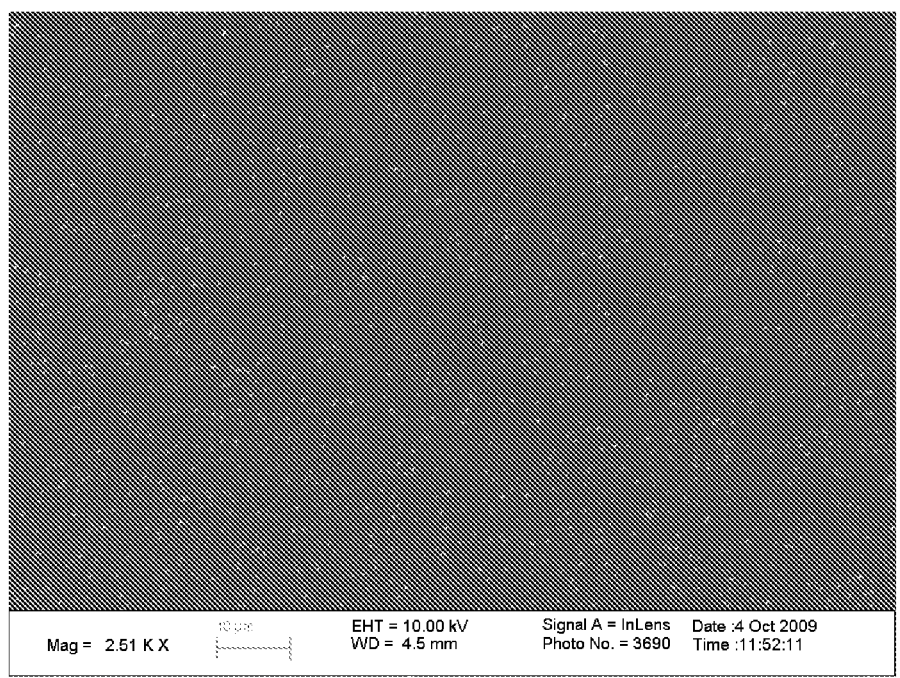
FIG. 3d shows a SEM-photograph of molybdenum particles produced in accordance with an embodiment of the process according to the invention.

FIG. 3c shows a photograph taken in transmission electron microscope (TEM) of a particle obtained in the second test. The white line in the left lower corner illustrates the distance 20 nm, thus showing that the size of the particle was in the order of about 200 nm. FIG. 3d shows SEM-photograph of the particles at a magnification of 2510 times. As shown in FIGS. 3c and 3d, the particles were essentially spherical, had a smooth surface and were single crystalline. Moreover, the particles were not agglomerated and thus finely dispersed. Furthermore, a higher concentration of obtained particles, compared to the previous test, was observed.

Comparing the particles shown in FIG. 3a with the particle shown in FIG. 3c clearly show that the appearance of the surface of the particles from the first and second tests, respectively, differs. This indicates that the particles in the different tests were formed at different temperatures.

Experimental Results—Titanium Particles Particles of titanium were produced by means of a vertically arranged hollow cathode plasma generating apparatus, using a pulsed direct current power supply. The duration of the pulses was set to 30 μs, and the pulses were applied using a square pulse with a frequency of 600 Hz. The average power supply to the hollow cathode was about 88 W, applied using maximally about 50 A and maximally about −536 V.

The cathode had an inner diameter of 5 mm and a length of 50 mm. Argon was used as process gas and introduced into the apparatus from the side, below the hollow cathode. The pressure was controlled at about 1.0 Torr.

The particles were collected on a substrate without any voltage applied to the substrate.

Figure 4A:
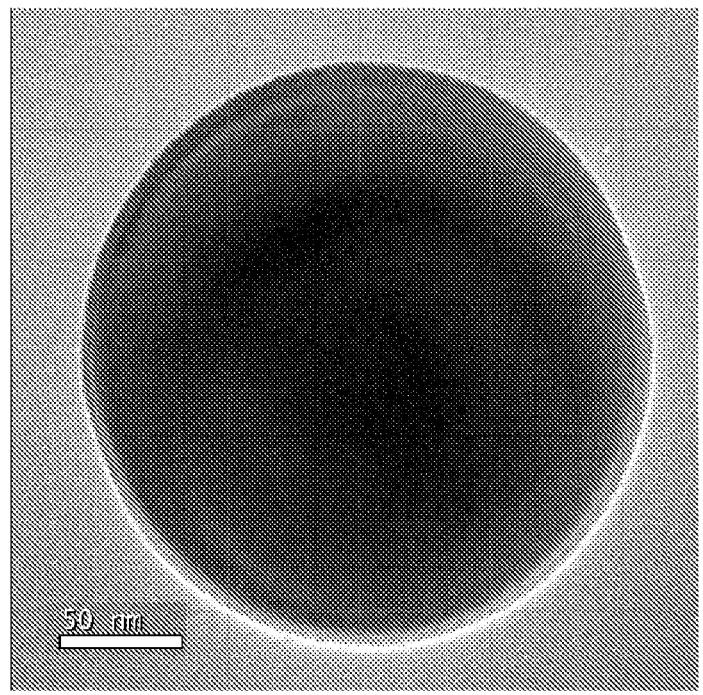
FIG. 4a shows a TEM-photograph of a titanium particle produced in accordance with an embodiment of the process according to the invention.
Figure 4B:
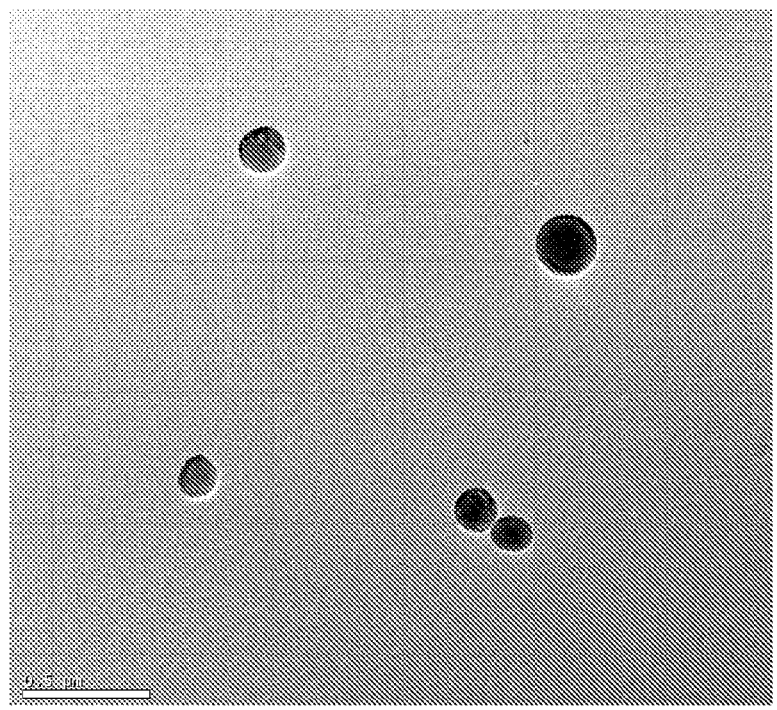
FIG. 4b shows a TEM-photograph of titanium particles produced in accordance with one embodiment of the process according to the invention.

FIG. 4a shows a photograph taken in transmitting electron microscope (TEM) of a particle obtained, and wherein the white line in the lower left corner shows the distance 50 nm. FIG. 4b shows a corresponding TEM-photograph of several particles, and wherein the white line in the lower left corner shows the distance 5 µm. The particles were found to be single crystals.

The invention claimed is:

1. A plasma sputtering process for producing particles having a size of about 1 nm to about 10 µm by growth to said size of the particles through pick-up of sputtered target atoms on the surface of grains, the grains constituting previously formed particles or particle nuclei, the process comprising
providing a target in a plasma generating apparatus, said apparatus having a characteristic length $L_c$ wherein $L_c^3$ equals the volume of the plasma generated in said apparatus,
introducing a process gas into said plasma generating apparatus and controlling the pressure inside the plasma generating apparatus in order to obtain a process gas number density $n_G$,
creating a plasma inside said plasma generating apparatus and controlling the energy provided to said plasma in order to obtain a plasma electron number density $n_e$ and a plasma electron temperature $T_e$,
sputtering atoms from said target by means of said plasma,
allowing the sputtered atoms to be picked-up on the surface of the grains, the grains being present in the plasma, thus producing the particles having a size of about 1 nm to about 10 µm, and
collecting the produced particles,
wherein the plasma electron number density $n_e$ and plasma electron temperature $T_e$ are sufficient to cause ionization of at least a part of the sputtered target atoms thus resulting in a pick-up flux of ionized sputtered target atoms on the surface of the grains;
wherein the following criterion is fulfilled $L_{ITA}/L_c \leq 0.5$ where $L_{ITA}$ is the mean free path of the ionized sputtered target atoms inside said plasma,
wherein the plasma generating apparatus is operated by a pulsed electric power supply with a frequency of at least 100 Hz and with a duration of the pulses of at least 5 microseconds, and
wherein the energy provided to the plasma is sufficient to obtain ionization of at least 20 % of the sputtered atoms in said plasma.

2. The process of claim 1 wherein $\Gamma_{ITA}/(\Gamma_{ITA}+\Gamma_{NTA})$ 0.5, wherein $\Gamma_{ITA}$ is the pick-up flux of ionized target atoms on the surface of grains and $\Gamma_{NTA}$ is the pick-up flux of neutral target atoms on the surface of grains.

3. The process of claim 1 wherein the energy provided to the plasma is sufficient to obtain ionization of at least 30% of the sputtered atoms in said plasma.

4. The process of claim 1 wherein the plasma generating apparatus is a hollow cathode apparatus.

5. The process of claim 1 wherein the plasma generating apparatus is a magnetron sputtering apparatus.

6. The process of claim 1 wherein $(1+3L_c/L_{ITA})(1+4W_e/W_{ITA})>10$, wherein $W_{ITA}$ is the average kinetic energy of ionized sputtered atoms in said plasma and $W_e$ is the average electron kinetic energy inside said plasma related to $T_e$ through $W_e=(3/2)k_BT_e$.

7. The process of claim 1 wherein the electric power is supplied essentially in the form of square pulses.

8. The process of claim 1 wherein the pulsed electric power supply is applied with a frequency of 200 -2000 Hz and with a duration of the pulses of 10-100 microseconds.

9. The process of claim 1 wherein the average power applied to the cathode is at least 30,000 W/m².

10. The process of claim 1 wherein the process gas number density $n_G$ and the electron number density $n_e$ are such that $$\frac{W_{ITA}}{W_e} \leq 0.5$$

wherein $W_{ITA}$ is the average kinetic energy of ionized sputtered atoms in said plasma and $W_e$ is the average electron kinetic energy inside said plasma related to $T_e$ through $W_e=(3/2)k_BT_e$.

11. The process of claim 1 wherein $$\frac{L_{ITA}}{L_c} \leq 0.4.$$

12. The process of claim 11 wherein $$\frac{W_{ITA}}{W_e} \leq 0.4.$$

13. The process of claim 1 wherein the process gas is an inert gas, a reactive gas, a gas mixture of inert gases, or a gas mixture comprising at least a reactive gas.

14. The process of claim 1 wherein said plasma is created at least partly of said process gas.

15. The process of claim 1 wherein the process gas is an inert gas, and the process further comprises introducing a reactive gas or a gas mixture comprising a reactive gas, into said plasma generating apparatus.

16. The process of claim 1 wherein said grains are introduced into said plasma generating apparatus.

17. The process of claim 1 wherein said grains are formed in-situ in said plasma generating apparatus.

18. The process of claim 1 wherein the plasma electron number density $n_e$ is at least $10^{17}$ per m³.

19. The process of claim 1 wherein the process produces particles having a size ranging from about 5 nm to about 500 nm.

20. The process of claim 2 wherein $\Gamma_{ITA}/(\Gamma_{ITA}+\Gamma_{NTA}) \geq 0.66$.

21. The process of claim 20 wherein $\Gamma_{ITA}/(\Gamma_{ITA}+\Gamma_{NTA}) \geq 0.70$.

22. The process of claim 11 wherein $$\frac{L_{ITA}}{L_c} \leq 0.3.$$

23. The process of claim 12 wherein $$\frac{W_{ITA}}{W_e} \leq 0.3.$$

24. The process according to claim 1, wherein collecting the produced particles comprises cooling the produced particles and thereafter collecting the particles on a substrate.

25. The process according to claim 1, wherein collecting the produced particles is performed by a system wherein the produced particles are suspended in a carrier gas.

* * * * *

UNITED STATES PATENT AND TRADEMARK OFFICE
CERTIFICATE OF CORRECTION

| | |
|---|---|
| PATENT NO. | : 9,447,493 B2 |
| APPLICATION NO. | : 13/579862 |
| DATED | : September 20, 2016 |
| INVENTOR(S) | : Ulf Helmersson, Nils Brenning and Daniel Soderstrom |

Page 1 of 1

It is certified that error appears in the above-identified patent and that said Letters Patent is hereby corrected as shown below:

In the Specification

In Column 11, Line 52, after the word invention change "may be suitably is performed" to --may suitably be performed--.

Signed and Sealed this
Thirtieth Day of May, 2017

Michelle K. Lee
*Director of the United States Patent and Trademark Office*